United States Patent
Inoue et al.

(10) Patent No.: US 7,871,896 B2
(45) Date of Patent: Jan. 18, 2011

(54) PRECISION TRENCH FORMATION THROUGH OXIDE REGION FORMATION FOR A SEMICONDUCTOR DEVICE

(75) Inventors: Fumihiko Inoue, Fukushima-Ken (JP); Takayuki Maruyama, Fukushima-Ken (JP); Tomohiro Watanabe, Fukushima-Ken (JP)

(73) Assignee: Spansion, LLC, Sunnyvale, CA (US)

( * ) Notice: Subject to any disclaimer, the term of this patent is extended or adjusted under 35 U.S.C. 154(b) by 160 days.

(21) Appl. No.: 12/134,087

(22) Filed: Jun. 5, 2008

(65) Prior Publication Data

US 2008/0305614 A1    Dec. 11, 2008

(30) Foreign Application Priority Data

Jun. 5, 2007    (JP)    ............................. 2007-149793

(51) Int. Cl.
*H01L 21/762*    (2006.01)
(52) U.S. Cl. ................ 438/424; 438/448; 257/E21.552
(58) Field of Classification Search .............. 438/448, 438/424; 257/E21.552
See application file for complete search history.

(56) References Cited

U.S. PATENT DOCUMENTS

| 5,895,252 | A  | * | 4/1999 | Lur et al. ................... 438/423 |
| 6,271,092 | B1 | * | 8/2001 | Lee ............................ 438/279 |
| 2003/0068875 | A1 | * | 4/2003 | Son ............................ 438/587 |

FOREIGN PATENT DOCUMENTS

JP    59-031067    2/1984

* cited by examiner

*Primary Examiner*—Thanh Nguyen

(57) ABSTRACT

Structures and methods for precision trench formation are disclosed. In one embodiment, a method for manufacturing a semiconductor device comprises forming a first oxygen-containing region in a semiconductor substrate by performing an oxygen ion implantation to a portion of the semiconductor substrate, and oxidizing the first oxygen-containing region using oxygen contained therein by performing a thermal processing to the semiconductor substrate, where the first oxygen-containing region is converted to a first oxide region. The method further comprises forming a groove in the semiconductor substrate by eliminating the first oxide region, where the performing thermal processing comprises subjecting the first oxygen-containing region to a gas low on oxygen.

11 Claims, 16 Drawing Sheets a)

b)

under this embodiment. FIG. 4 is a graph illustrating a Monte Carlo simulation

PRECISION TRENCH FORMATION THROUGH OXIDE REGION FORMATION FOR A SEMICONDUCTOR DEVICE

CLAIM OF PRIORITY

This application claims priority from Japanese patent application 2007-149793 filed on Jun. 5, 2007.

FIELD OF TECHNOLOGY

The present invention relates to semiconductor devices and methods, particularly to trench formation.

BACKGROUND

FIG. 1(a) through 1(c) show cross sectional views representing a method for forming a groove 16 in a semiconductor substrate 10 using a dry etching process. In FIG. 1(a), an oxide film 12 is formed on the surface of the semiconductor substrate 10, and a nitride film 14 is formed on the oxide film 12. In FIG. 1(b), a photoresist formed into a predetermined pattern is used to etch the nitride film 14 and the oxide film 12. In FIG. 1(c), the semiconductor substrate 10 is dry etched using the nitride film 14 as a mask. Then, the groove 16 is formed in the semiconductor substrate 10.

Since there is no marker or means present in the semiconductor substrate 10 which can tell whether the right depth has been reached for the groove 16, the dry etching for forming the groove 16 has to rely on the etching time only. However, the etching rate varies depending on the state within the chamber of the etching device, so this difference makes it difficult to form the groove 16 in a reliable fashion.

In another method of forming the groove 16, an oxygen ion is implanted into the semiconductor substrate 10 using the nitride film 14. The nitride film 14 is formed on the semiconductor substrate 10 in a predetermined pattern, and is used as the mask. The semiconductor substrate 10 is thermally oxidized by oxygen gas to form an oxide region defined by the nitride film 14. Then, the oxide region is eliminated by performing a wet etching to form the groove 16 in the semiconductor substrate 10.

However, the thermal oxidation of the semiconductor substrate 10 using the oxygen gas generates a relatively large portion of so called a bird's beak 19 as shown in FIG. 2. The bird's beak 19 denotes the portion of the oxide region 18 on the surface of the semiconductor substrate 10 masked with the nitride film 14. Accordingly, the deformation in the semiconductor substrate 10 makes it difficult to form a groove with a narrow width.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

One embodiment of the present invention is directed to a method for manufacturing a semiconductor device which comprises forming a first oxygen-containing region in a semiconductor substrate by performing an oxygen ion implantation to a portion of the semiconductor substrate, and oxidizing the first oxygen-containing region using oxygen contained therein by performing a thermal processing to the semiconductor substrate, where the first oxygen-containing region is converted to a first oxide region. The method further comprises forming a groove in the semiconductor substrate by eliminating the first oxide region, where the performing thermal processing comprises subjecting the first oxygen-containing region to a gas low on oxygen.

As illustrated in the detailed description, other embodiments pertain to methods that improve the formation of trench or groove in a semiconductor substrate and structures thereof. By using a photoresist and/or polysilicon film as a mask and thermally processing with a gas low on oxygen, such as an inert gas, a groove with a narrow width can be formed with minimal deformation.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the description that follows.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Some portions of the detailed descriptions that follow are presented in terms of procedures, logic blocks, processing, and other symbolic representations for fabricating semiconductor devices. These descriptions and representations are the means used by those skilled in the art of semiconductor device fabrication to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Unless specifically stated otherwise as apparent from the following discussions, is appreciated that throughout the present application, discussions utilizing terms such as "forming," "performing," "producing," "depositing," or "etching," or the like, refer to actions and processes of semiconductor device fabrication.

Briefly stated, embodiments pertain to structures and methods that improve the formation of trench or groove in a semiconductor substrate and structures thereof. By using a photoresist and/or polysilicon film as a mask and thermally processing with a gas low on oxygen, such as an inert gas, a groove with a narrow width can be formed with minimal deformation.

First Embodiment

Figure 3A:
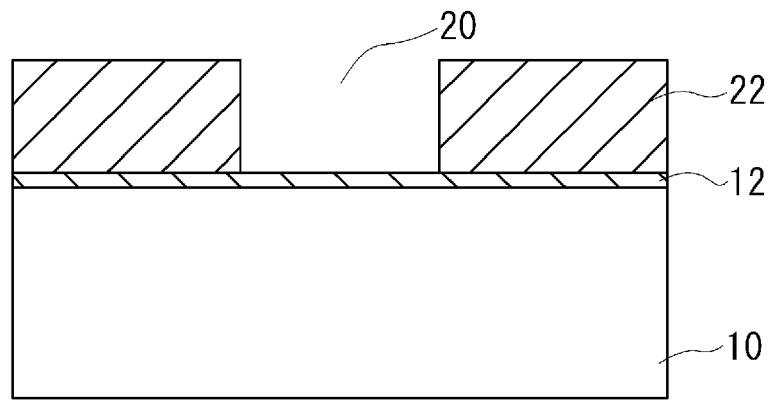
FIG. 3(a) through FIG. 3(d) show cross sectional views representing the method for forming a groove, according to a first embodiment.
Figure 3B:
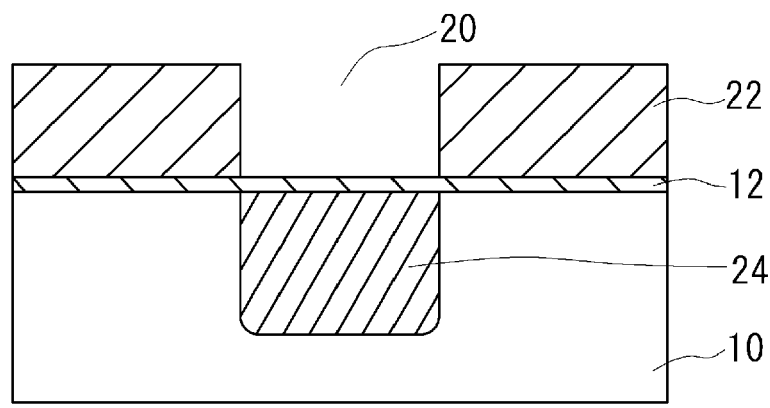
Figure 3C:
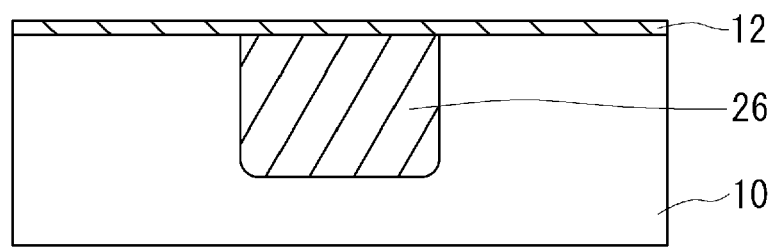
Figure 3D:
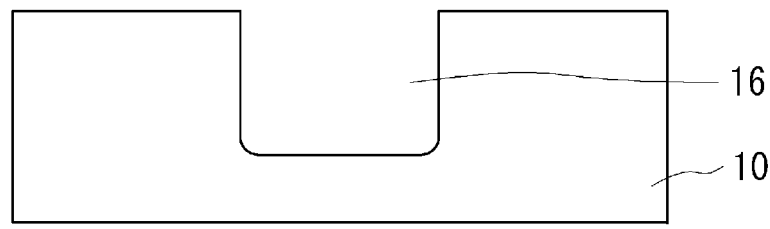

FIG. 3(a) through FIG. 3(d) show cross sectional views representing the method for forming a groove 16, according to a first embodiment. In FIG. 3(a), an oxide film is formed on a semiconductor substrate 10 (e.g., a silicon substrate), and a photoresist 22 having an opening 20 is formed on the oxide film 12. In FIG. 3(b), an oxygen ion is implanted into a portion of the semiconductor substrate 10 using the photoresist 22 as the mask. During the oxygen ion implantation, the semiconductor substrate 10 is bombarded with a dose of $3.0 \times 10^{17}$ oxygen ions/cm$^2$ at implantation energy of 200 KeV, a dose of $2.5 \times 10^{17}$ oxygen ions/cm$^2$ at implantation energy of 120 KeV, and a dose of $2.5 \times 10^{17}$ ions/cm$^2$ at implantation energy of 40 KeV. Then, a first oxygen-containing region 24 is formed in the semiconductor substrate 10. In FIG. 3(c), the photoresist 22 is eliminated, and then the semiconductor substrate 10 is subjected to a thermal processing for one hour with Ar (argon) gas at 1200° C. The first oxygen-containing region 24 is changed to a first oxide region 26 by oxygen contained in the first oxygen-containing region 24. In FIG. 3(d), a wet etching is performed using hydrofluoric acid to eliminate the oxide film 12 and the first oxide region 26 to form the groove 16 in the semiconductor device 10.

Figure 4:
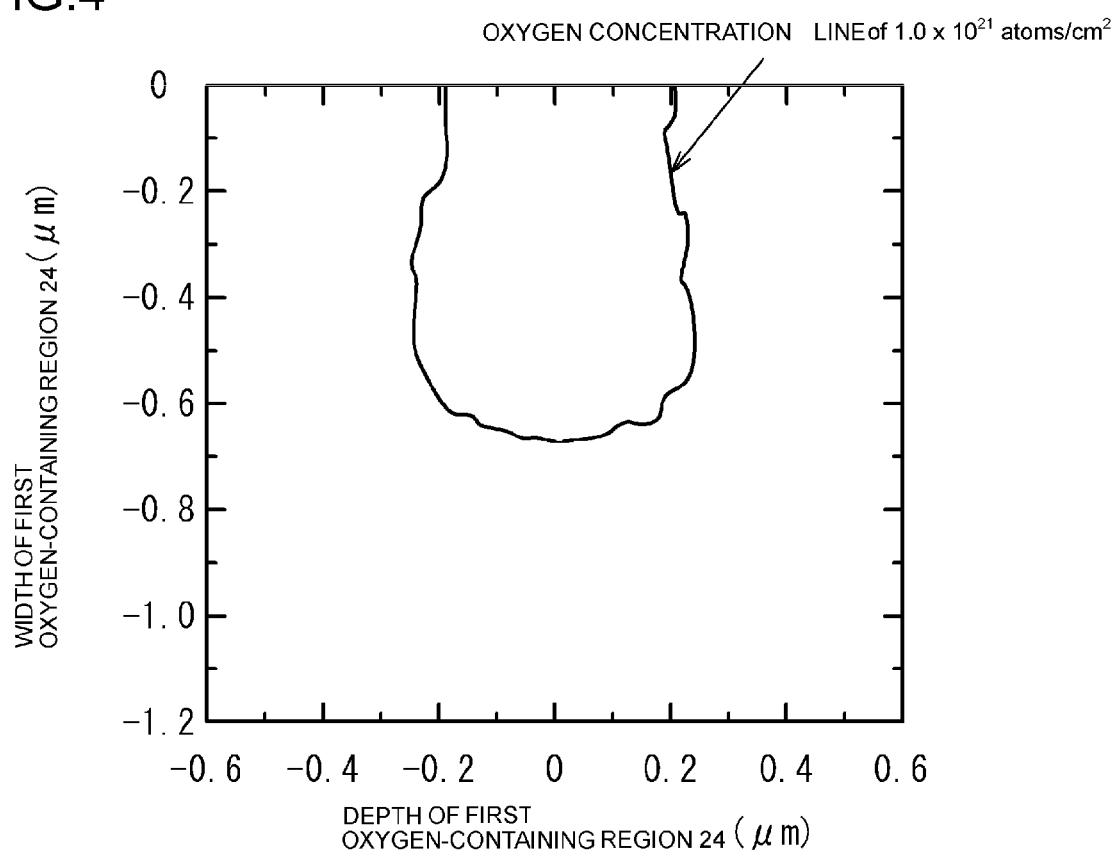
FIG. 4 is a graph illustrating a Monte Carlo simulation result of an oxygen concentration line of $1.0 \times 10^{21}$ atoms/cm$^2$ in an oxygen-containing region, according to the first embodiment.

FIG. 4 is a graph illustrating a Monte Carlo simulation result of an oxygen concentration line of $1.0 \times 10^{21}$ atoms/cm$^2$ in the first oxygen-containing region 24, according to the first embodiment. In the area inside the oxygen concentration line, the oxygen concentration is higher than $1.0 \times 10^{21}$ atoms/cm$^2$. The oxygen concentration line is set to $1.0 \times 10^{21}$ atoms/cm$^2$ sufficiently high to form the first oxide region 26 after the thermal processing. The longitudinal axis of the graph shows the depth of the first oxygen-containing region 24, and the horizontal axis shows the width of the first oxygen-containing region 24. The first oxygen-containing region 24 has an approximately 0.6 um deep U-like shape.

Figure 5:
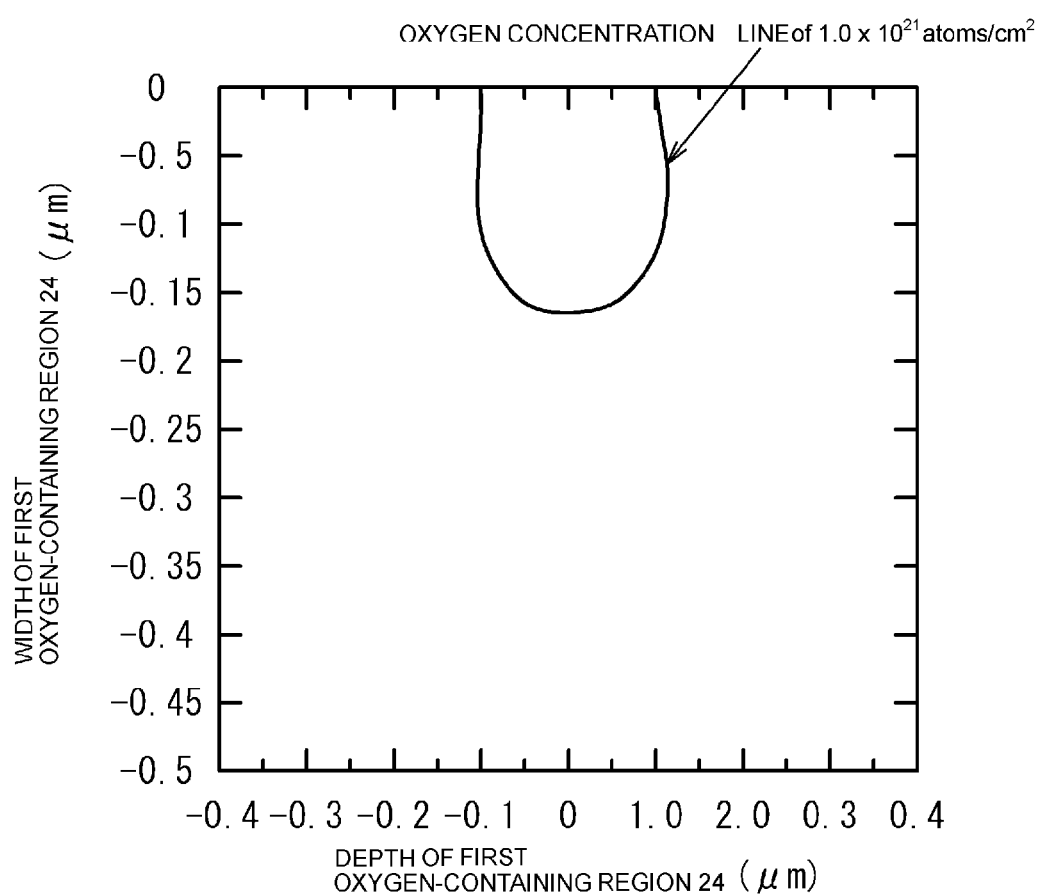
FIG. 5 is a graph illustrating a Monte Carlo simulation result of the oxygen concentration line of $1.0 \times 10^{21}$ atoms/cm$^2$ in an oxygen-containing region where a dose of $2.5 \times 10^{17}$ oxygen ions/cm$^2$ at implantation energy of 30 KeV are implanted into a semiconductor substrate, according to the first embodiment.

FIG. 5 is a graph illustrating a Monte Carlo simulation result of the oxygen concentration line of $1.0 \times 10^{21}$ atoms/cm$^2$ in the first oxygen-containing region 24 where the dose of $2.5 \times 10^{17}$ oxygen ions/cm$^2$ at the implantation energy of 30 KeV are implanted into the semiconductor substrate 10, according to the first embodiment. In FIG. 5, the longitudinal axis of the graph denotes the depth of the first oxygen-containing region 24, and the horizontal axis denotes the width of the first oxygen-containing region 24. In FIG. 5, the first oxygen-containing region 24 has a 0.17 um deep U-like shape.

According to the first embodiment, the oxygen ions are implanted into a portion of the semiconductor substrate 10 so as to form the first oxygen-containing region 24. Thereafter, the semiconductor substrate 10 is thermally processed to oxidize the first oxygen-containing region 24 using oxygen contained therein. Thus, the first oxygen-containing region 24 is changed to the first oxide region 26. The first oxide region 26 is eliminated by wet etching, and the groove 16 is formed in the semiconductor substrate 10. The depth of the groove 16 is determined by that of the first oxide region 26, in other words, the first oxygen-containing region 24. In FIG. 4 and FIG. 5, the depth of the first oxygen-containing region 24 is determined by that of the oxygen ion implantation. Accordingly, the depth of the groove 16 is controlled based on the depth of the oxygen ion implantation, in other words, the energy for the oxygen ion implantation.

Figure 1A:
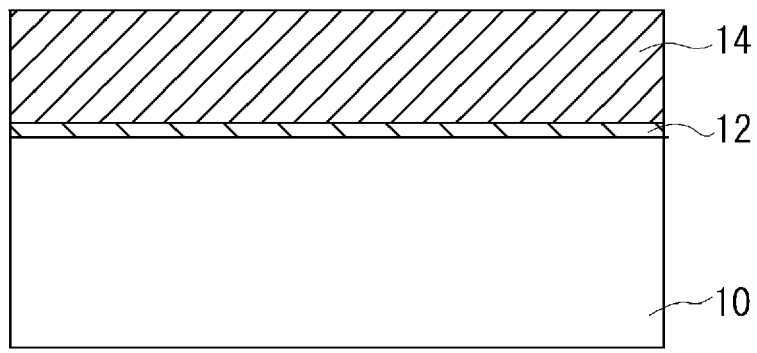
FIG. 1(a) through 1(c) show cross sectional views representing a method for forming a groove in a semiconductor substrate using a dry etching process.
Figure 1B:
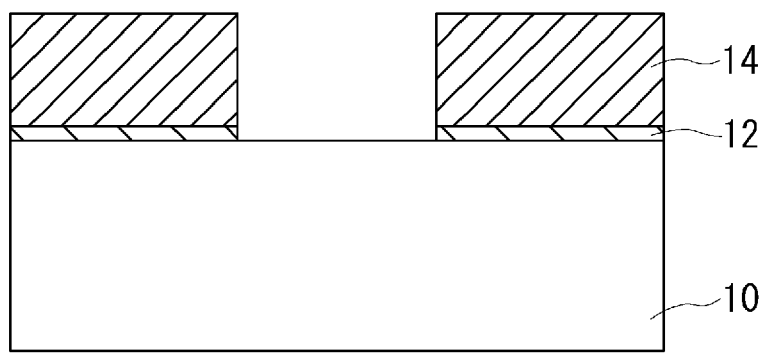
Figure 1C:
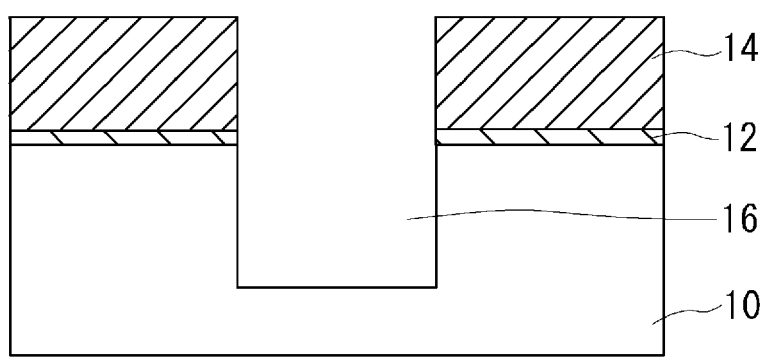
Figure 2:
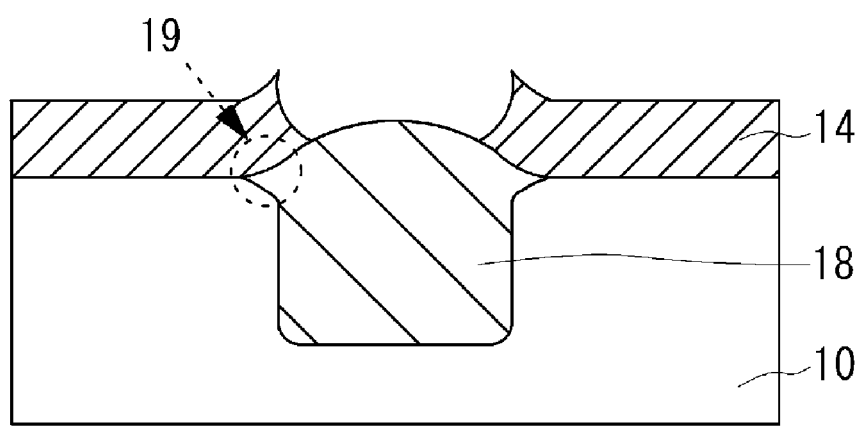
FIG. 2 is a cross sectional view illustrating a deformed groove formed in the aftermath of a conventional groove forming process.

In the first embodiment, the semiconductor substrate 10 is thermally processed for one hour with Ar gas at 1200° C. as shown in FIG. 3(c). The first oxygen-containing region 24 is oxidized by oxygen contained therein, and is changed to the first oxide region 26. The first embodiment enables the formation of the groove 16 with a narrow width. It is appreciated that any type of gas (e.g., an inert gas, a gas with no or little oxygen content, etc.) may be used as long as the first oxygen-containing region 24 is changed into the first oxide region 26 while suppressing oxidization of the surface of the semiconductor substrate 10. In other words, the thermal processing according to the first embodiment does not generate the bird's beak portion 19 of FIG. 2. It is also appreciated that the thermal processing can be performed at different temperatures.

In FIG. 3(b), the first oxygen-containing region 24 is formed by implanting the dose of $3.0 \times 10^{17}$ oxygen ions/cm$^2$ at the implantation energy of 200 KeV, the dose of $2.5 \times 10^{17}$ oxygen ions/cm$^2$ at the implantation energy of 120 KeV, and the dose of $2.5 \times 10^{17}$ oxygen ions/cm$^2$ at the implantation energy of 40 KeV to the semiconductor substrate 10. However, the process is not limited to the doses and the implantation energies.

Figure 6A:
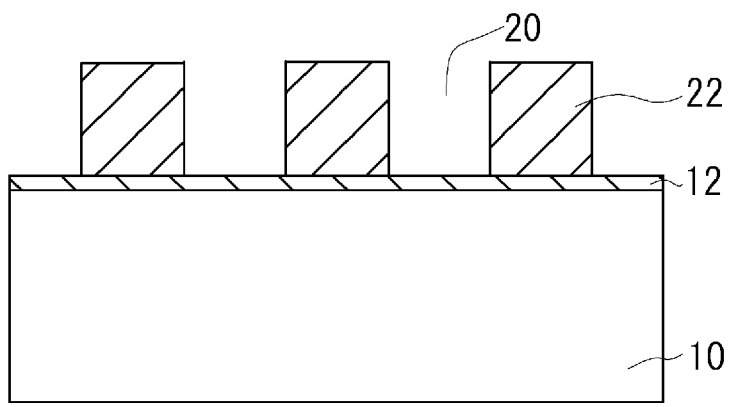
FIG. 6(a) through FIG. 6(d) are cross sectional views illustrating another method for forming a groove, as a variation of the first embodiment.
Figure 6B:
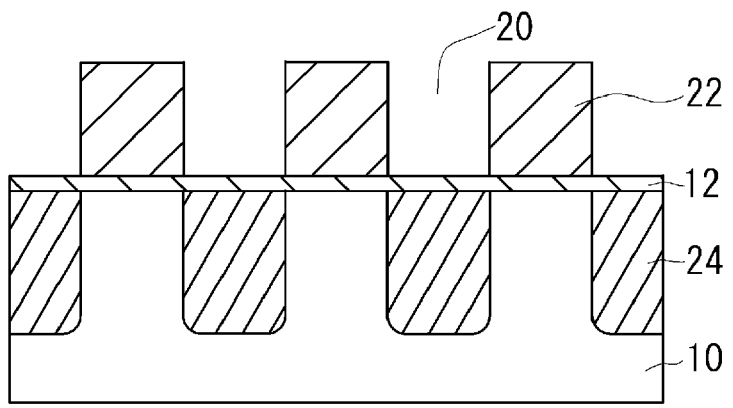
Figure 6C:
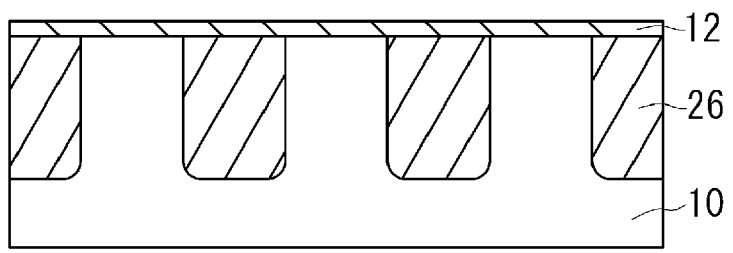
Figure 6D:
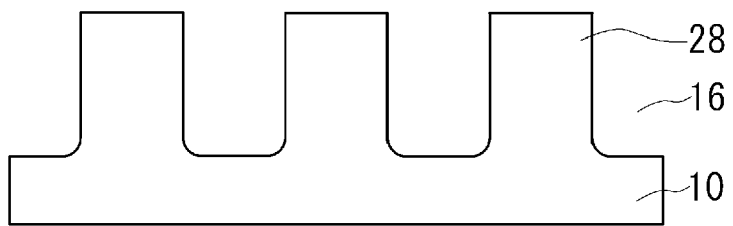

FIG. 6(a) through FIG. 6(d) are cross sectional views representing another method for forming the groove 16, as a variation of the first embodiment. In this embodiment, the pattern of the photoresist 22 is different from the one according to the first embodiment, and multiple openings 20 are formed. Accordingly, the first oxygen-containing regions 24, the first oxide regions 26, and the grooves 16 are formed. Other features are the same as those of the first embodiment as shown in FIG. 3(a) through FIG. 3(d), so their descriptions are omitted. In this embodiment, the grooves 16 are formed in the semiconductor substrate 10 as shown in FIG. 6(d) such that protrusions 28 are defined by the grooves 16.

Second Embodiment

Figure 7A:
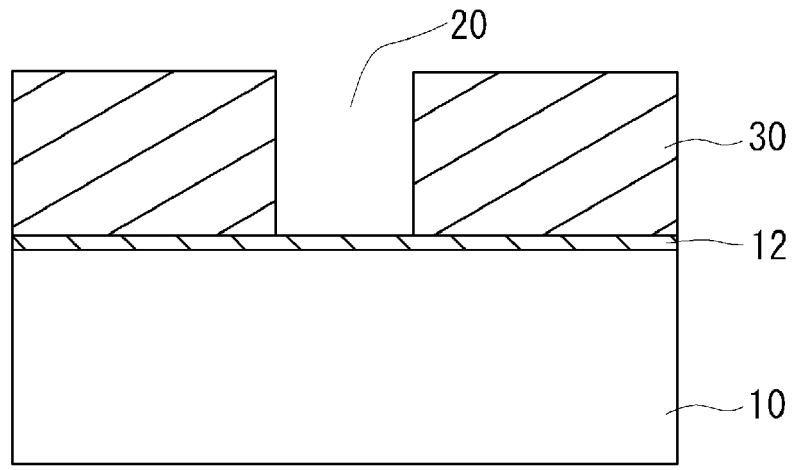
FIG. 7(a) through FIG. 8(c) are cross sectional views illustrating a method for forming a groove, according to a second embodiment.

FIG. 7(a) through FIG. 8(c) are cross sectional views illustrating a method for forming the groove 16, according to a second embodiment. In FIG. 7(a), a polysilicon film 30 with a predetermined pattern, which includes an opening 20, is formed on the oxide film 12. The oxygen ions are implanted into the semiconductor substrate 10 masked with the polysilicon film 30 to form the first oxygen-containing region 24 in the semiconductor substrate 10. The oxygen ions are implanted into the polysilicon film 30 to form a second oxygen-containing region 32 thereon. As the thickness of the polysilicon film 30 is preliminarily increased to prevent the oxygen ion from being implanted into the semiconductor substrate 10 through the polysilicon film 30, the oxygen ions are not implanted into the portion in contact with the polysilicon film 30 and the semiconductor substrate 10, thus leaving the polysilicon film 30 as it is. In FIG. 7(c), the semiconductor substrate 10 is thermally processed to change the first oxygen-containing region 24 to the first oxide region 26, and the second oxygen-containing region 32 to a second oxide region 34.

Figure 8A:
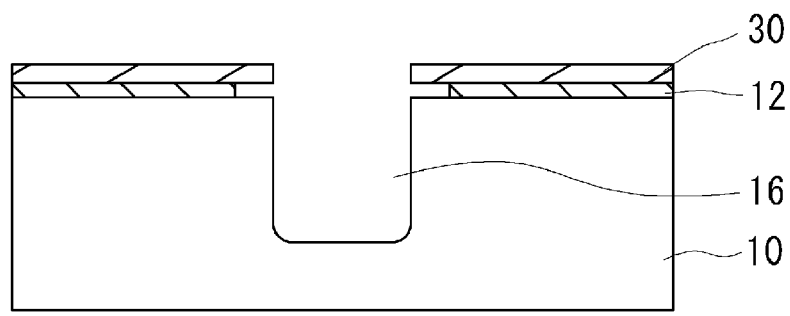
Figure 8B:
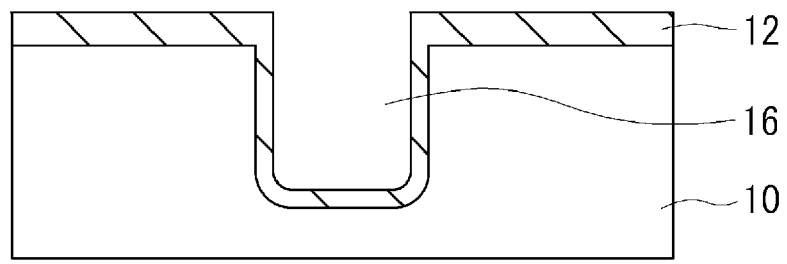
Figure 8C:
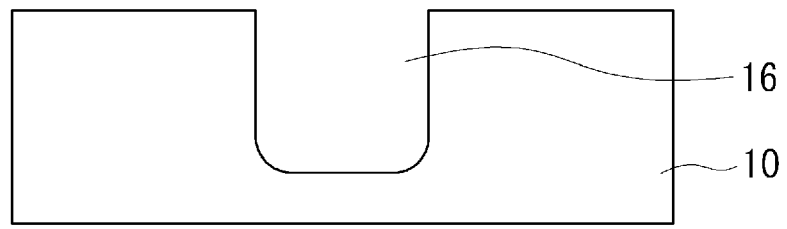
Figure 9A:
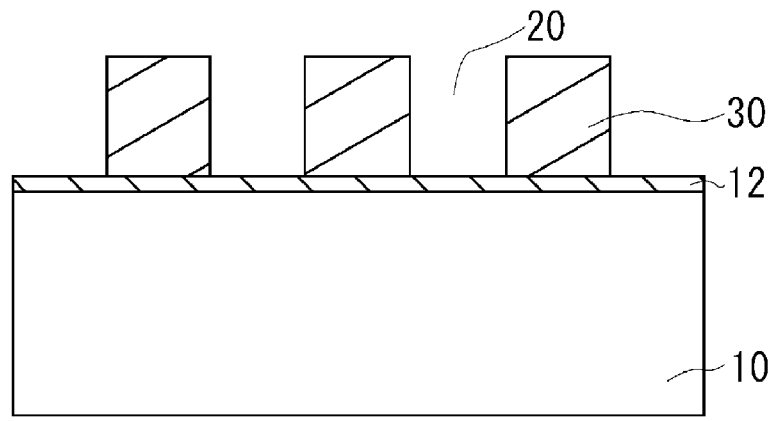
FIG. 9(a) through FIG. 10(c) show cross sectional views illustrating a method for forming multiple grooves, as a variation of the second embodiment.
Figure 9B:
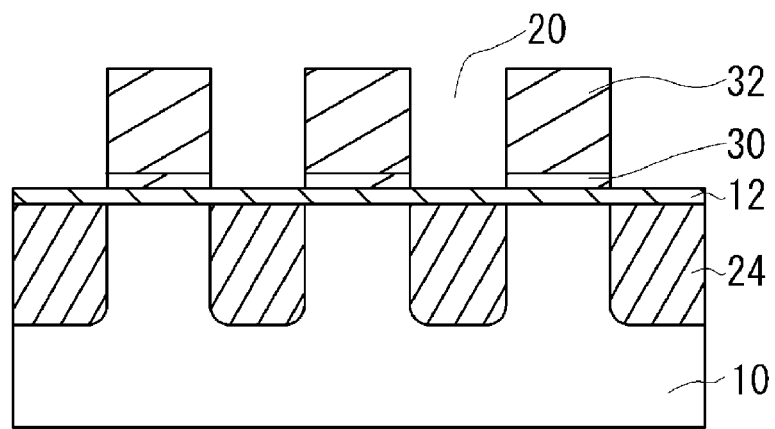
Figure 9C:
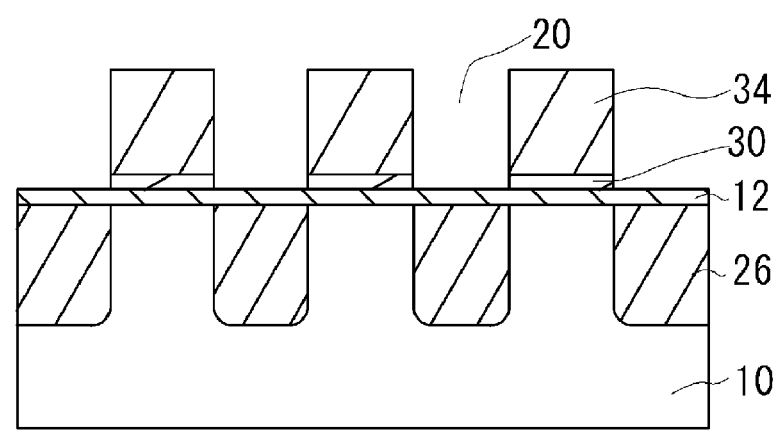
Figure 10A:
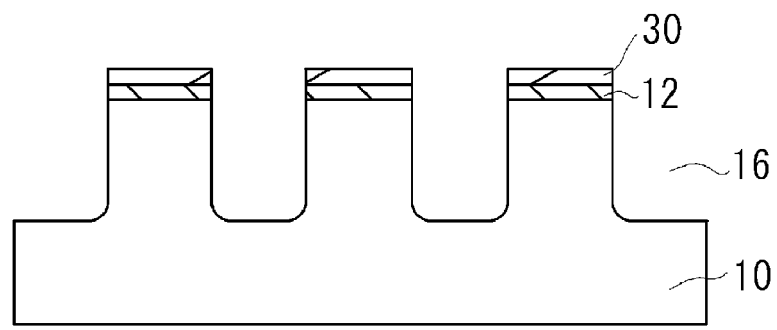
Figure 10B:
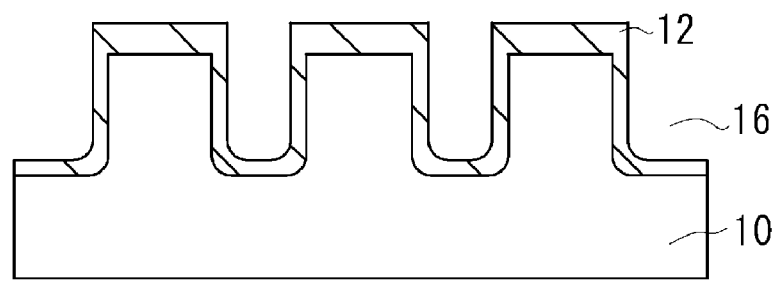
Figure 10C:
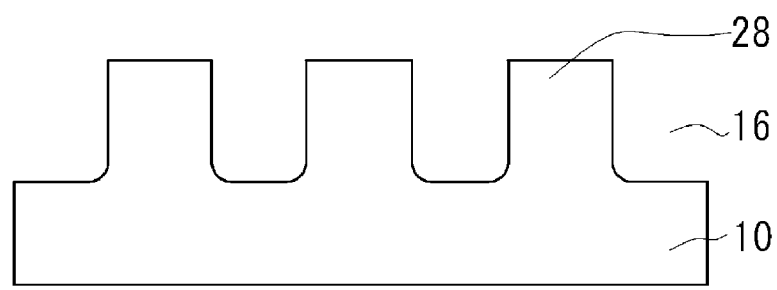

In FIG. 8(a), the first and the second oxide regions 26 and 34 are eliminated by a wet etching using hydrofluoric acid to form the groove 16 in the semiconductor substrate 10. The polysilicon film 30 in contact with the semiconductor substrate 10 cannot be etched by hydrofluoric acid, and is left as it is. In FIG. 8(b), the semiconductor substrate 10 is thermally oxidized with oxygen gas to form the oxide film 12 which contains the oxidized polysilicon film 30. In FIG. 8(c), the oxide film 12 is eliminated by performing the wet etching using hydrofluoric acid again.

Figure 7B:
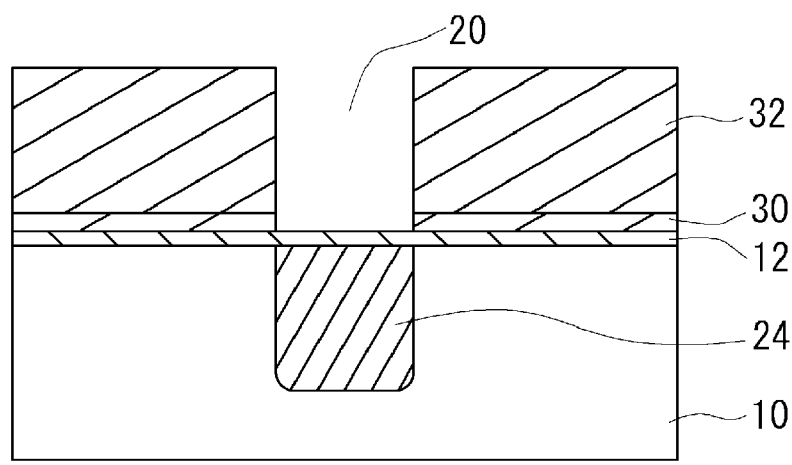

According to the second embodiment, the oxygen ion implantation is performed to form the first oxygen-containing region 24 using the polysilicon film 30 as a mask, as shown in FIG. 7(b). As the polysilicon film 30 has higher density than the photoresist 22, sufficient masking function may be obtained even if the polysilicon film 30 is not thick. The second embodiment using the polysilicon film 30 as the mask makes it possible to reduce the width of the opening 20 using the photoresist 22 as the mask. The second embodiment enables the formation of the first oxygen-containing region 24 with a narrow width, hence, the groove 16 with a narrow width. It is appreciated that the method described according to the second embodiment needs no additional step of eliminating the polysilicon film 30.

In FIG. 7(b), the oxygen ions are implanted into the semiconductor substrate 10 for forming the first oxygen-containing region 24. In the process, the semiconductor substrate 10 may have damaged portions. According to the second embodiment, after forming the groove 16, the semiconductor substrate 10 is thermally oxidized with oxygen gas to form the oxide film 12 on the surface of the semiconductor substrate 10, that is, on the surface of the groove 16 as shown in FIG. 8(b). Thereafter, the oxide film 12 is eliminated by the wet etching as shown in FIG. 8(c). The damaged portions around the groove 16 may be completely eliminated in the process.

Figure 7C:
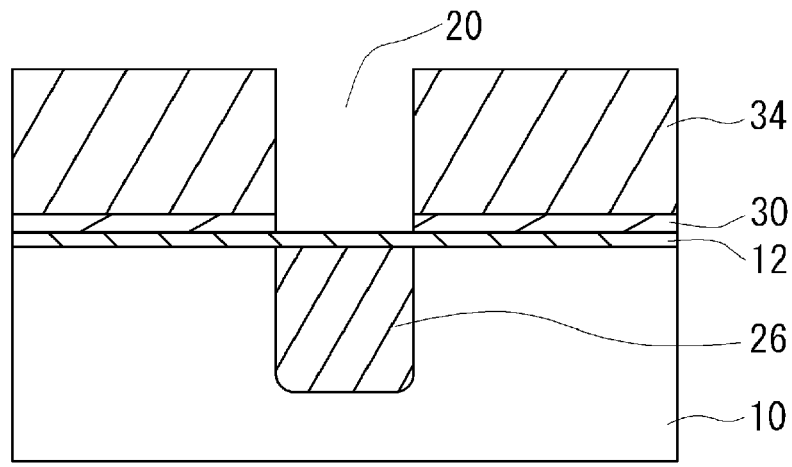

In the second embodiment, as shown in FIG. 7(b), upon implantation of the oxygen ions into the polysilicon film 30, the polysilicon film 30 is left as it is at the portion in contact with the semiconductor substrate 10. However, the thickness of the polysilicon film 30 may be preliminarily adjusted such that the oxygen ions cannot be implanted into the semiconductor substrate 10 through the polysilicon film 30. In the aforementioned case, the polysilicon film 30 is entirely changed to the second oxide region 34 through the thermal processing as shown in FIG. 7(c). The second oxide region 34 formed of the polysilicon film 30 may be eliminated completely by a wet etching process as shown in FIG. 8(a).

FIG. 9(a) through FIG. 10(c) show cross sectional views illustrating a method for forming multiple ones of the groove 16, as a variation of the second embodiment. In FIG. 9(a) through FIG. 10(c), with the multiple openings 20, the pattern of the polysilicon film 30 according to this embodiment is different from the second embodiment. Accordingly, the first oxygen-containing region 24, the first oxide regions 26, and the grooves 16 are formed. Other features are similar to those of the second embodiment as shown in FIG. 7(a) through FIG. 8(c), and descriptions thereof are omitted. According to this embodiment, protrusions 28 may be defined by the grooves 16.

Third Embodiment

Figure 11A:
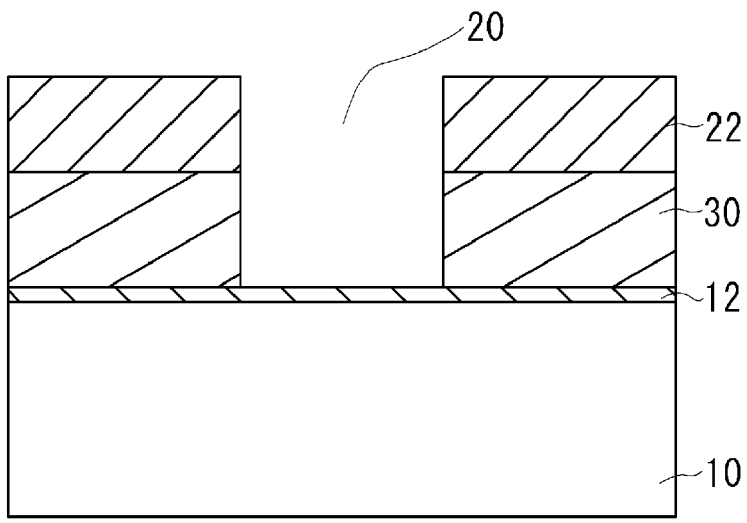
FIG. 11(a) through FIG. 12(c) are cross sectional views illustrating a method for forming a groove, according to a third embodiment.

FIG. 11(a) through FIG. 12(c) are cross sectional views illustrating a method for forming the groove 16, according to a third embodiment. In FIG. 11(a), the polysilicon film 30 is formed on the oxide film 12. The photoresist 22 with a predetermined pattern is formed on the polysilicon film 30. The polysilicon film 30 is dry etched with a Reactive Ion Etching (RIE) process using the photoresist 22 as the mask to form an opening 20 in the polysilicon film 30 and the photoresist 22. In FIG. 11(b), the oxygen ions are implanted into the semiconductor substrate 10 with the constant energy of 180 KeV using the polysilicon film 30 and the photoresist 22 as the mask. Then the first oxygen-containing region 24 is formed inside the semiconductor substrate 10. In FIG. 11(c), the photoresist 22 is eliminated, and then the semiconductor substrate 10 is thermally processed to change the first oxygen-containing region 24 into the first oxide region 26.

Figure 12A:
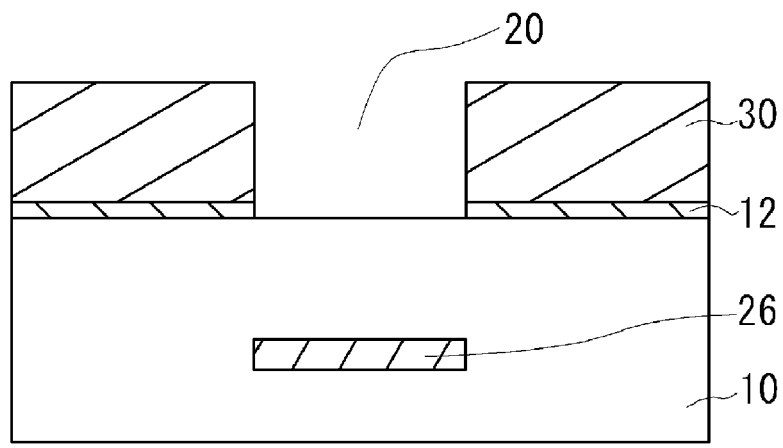
Figure 12B:
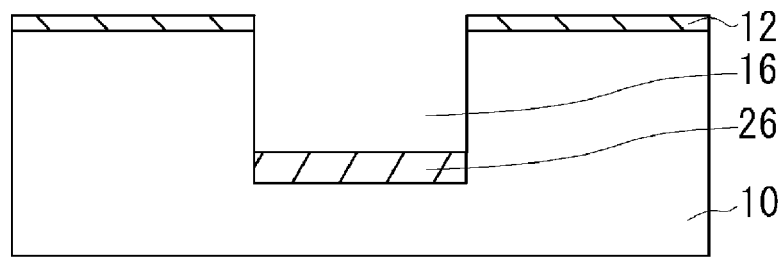
Figure 12C:
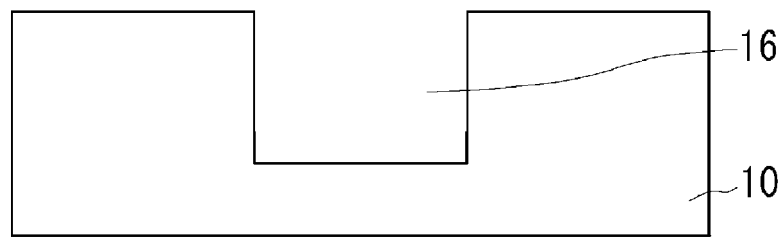

In FIG. 12(a), the oxide film 12 is dry etched through the RIE process using the polysilicon film 30 as the mask. In FIG. 12(b), the semiconductor substrate 10 above the first oxide region 26 is dry etched through the RIE process using the polysilicon film 30 and the oxide film 12 as the mask to form the groove 16. In FIG. 12(c), the oxide film 12 and the first oxide region 26 are eliminated by a wet etching process using hydrofluoric acid.

It is appreciated that the first oxide region 26 inside the semiconductor substrate 10 functions as a stopper layer in forming the groove 16 during the dry etching process illustrated in FIG. 12(b). The etching rate for the first oxide region 26 is considerably lower than that in the semiconductor substrate 10. The depth of the groove 16 can be determined based on the location of the first oxide region 26. The location of the first oxide region 26 in the semiconductor substrate 10, hence the depth of the groove 16 may be determined by the energy for the oxygen ion implantation.

In the third embodiment, since the dry etching is simultaneously performed to both the semiconductor substrate 10 and the polysilicon film 30 as shown in FIG. 12(b), it isn't necessary to have a separate step for eliminating the polysilicon film 30. As the oxide film 12 below the polysilicon film 30 serves as the stopper layer, the semiconductor substrate 10 below the polysilicon film 30 is hardly etched.

Figure 11B:
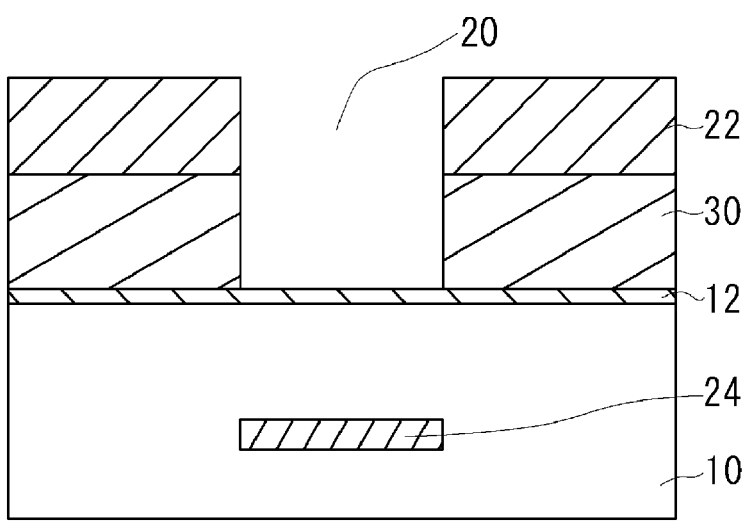
Figure 11C:
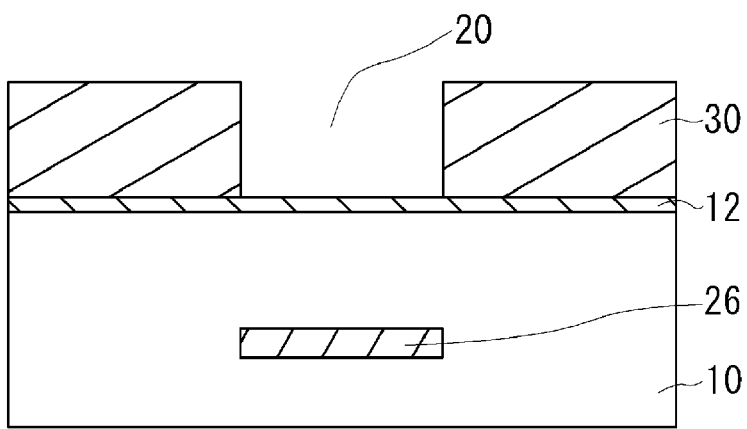

In the third embodiment, the oxygen ion implantation is performed using the polysilicon film 30 and the photoresist 22 formed thereon as the mask as shown in FIG. 11(b). Accordingly, no oxygen ion is implanted into the polysilicon film 30. When the semiconductor substrate 10 is thermally processed, the polysilicon film 30 is left as it is as shown in FIG. 11(c). Therefore, the semiconductor substrate 10 above the first oxide region 26 and the polysilicon film 30 may be dry etched simultaneously, thus eliminating the polysilicon film 30.

In the third embodiment, the oxygen ions are implanted into the semiconductor substrate 10 using the polysilicon film 30 and the photoresist 22 formed thereon as the mask as shown in FIG. 11(b) to form the first oxygen-containing region 24 inside the semiconductor substrate 10. Referring to FIG. 12(b), the semiconductor substrate 10 above the first oxide region 26 is etched using the polysilicon film 30 as the mask. In other words, both the oxygen ion implantation and etching to the semiconductor substrate 10 are performed using the polysilicon film 30 as the mask. The etching of the semiconductor substrate 10 is performed self-aligned to the first oxide region 26, that is, the first oxygen-containing region 24. In other words, the groove 16 may be formed self-aligned to the first oxide region 26.

In the third embodiment, the polysilicon film 30 is used as the mask for the oxygen ion implantation inside the semiconductor substrate 10, and etching thereto. However, the process is not limited to the one as described above. Any material may be employed so long as it may be eliminated without affecting the groove 16 formed in the semiconductor substrate 10. It is preferable to use the polysilicon film 30 which is etched simultaneously with the semiconductor substrate 10 and eliminated thereafter.

In the third embodiment, the oxygen ion implantation is performed with the energy for the implantation at 180 KeV as shown in FIG. 11(b). However, the condition is not limited to the one as described above. The oxygen ion implantation may be performed at different energy levels. In cases where the different energy levels are used for the oxygen ion implantation, the thickness of the first oxide region 26 may be increased.

Figure 13A:
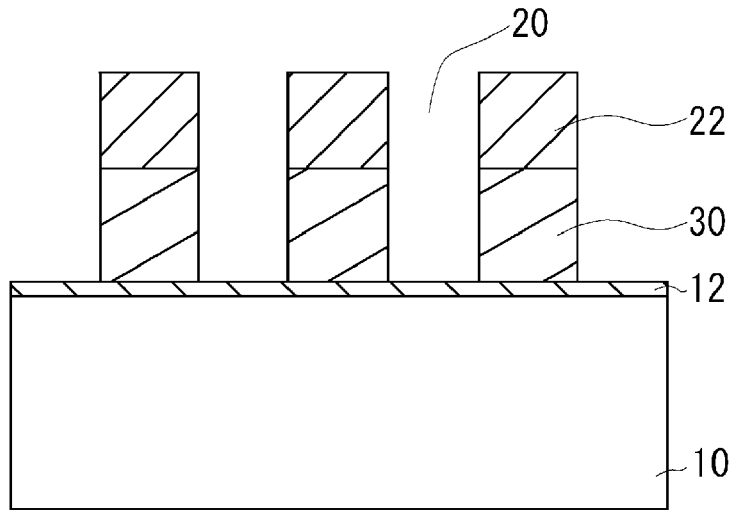
FIG. 13(a) through FIG. 14(c) are cross sectional views illustrating a method for forming the groove, as a variation of the third embodiment.
Figure 13B:
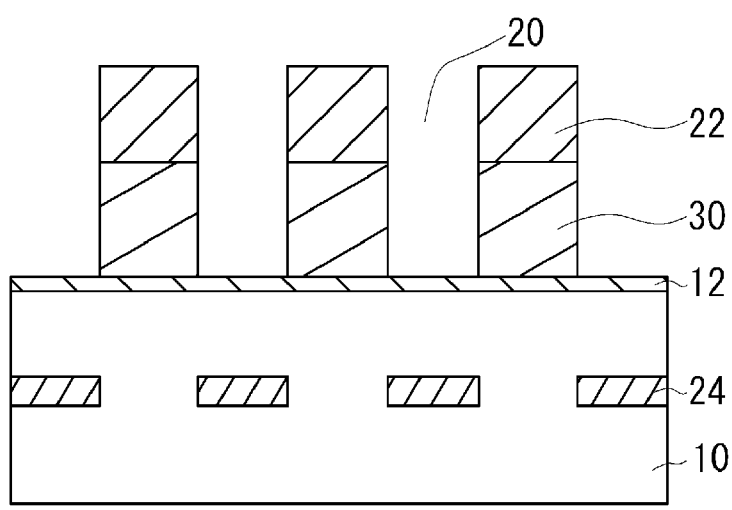
Figure 13C:
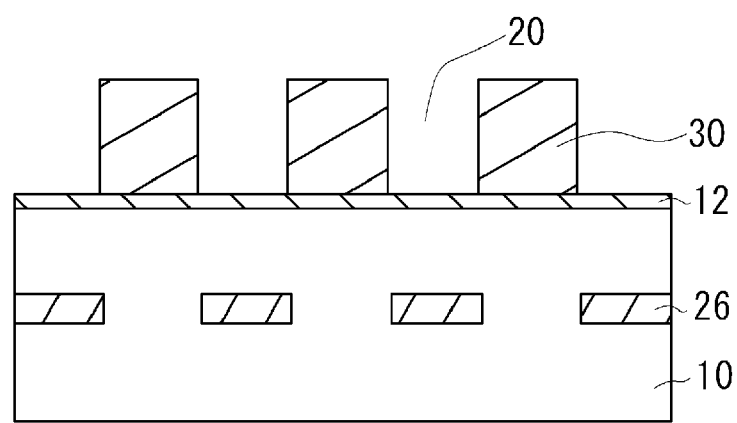
Figure 14A:
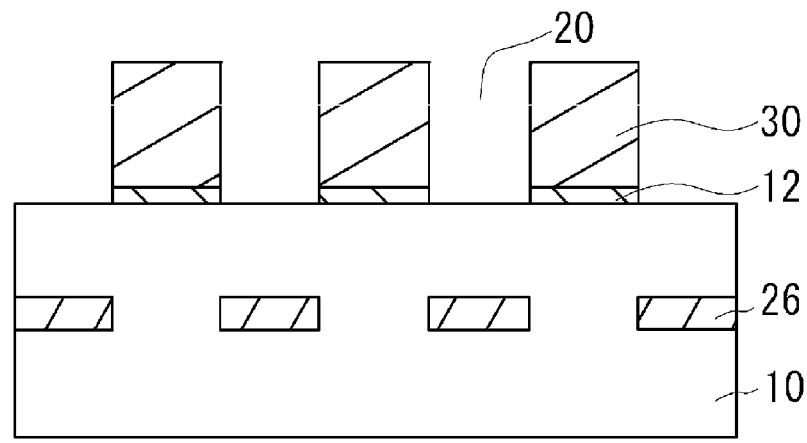
Figure 14B:
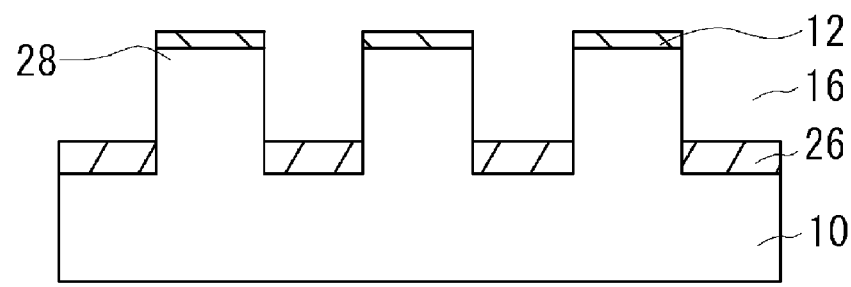
Figure 14C:
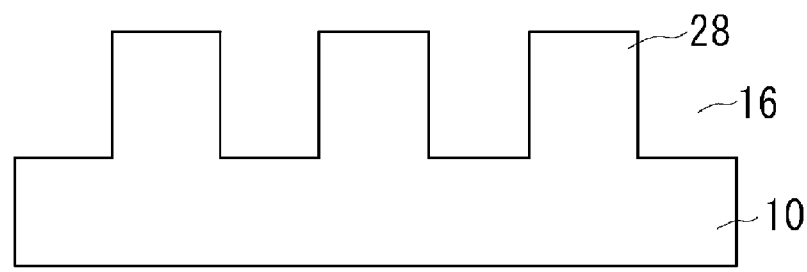

FIG. 13(a) through FIG. 14(c) are cross sectional views illustrating a method for forming the groove 16, as a variation of the third embodiment. In FIG. 13(a) through FIG. 14(c), each pattern of the polysilicon film 30 and the photoresist 22 is different from the third embodiment, and multiple openings 20 are formed in the variation. Accordingly, first oxygen-containing regions 24, that is, the first oxide regions 26 are formed, and the grooves 16 are formed as well. Other features are similar to those described in the third embodiment as shown in FIG. 11(a) through FIG. 12(c), and explanations thereof are omitted. As shown in FIG. 14(c), the protrusions 28 are defined by the grooves 16.

Fourth Embodiment

Figure 15A:
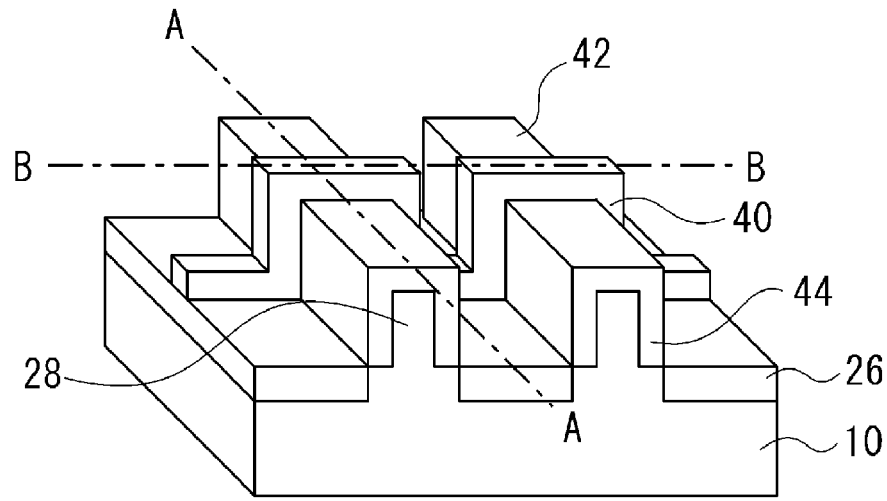
FIG. 15(a) through FIG. 15(c) are perspective views showing an exemplary flash memory with a Fin type SONOS structure, according to a fourth embodiment.
Figure 15B:
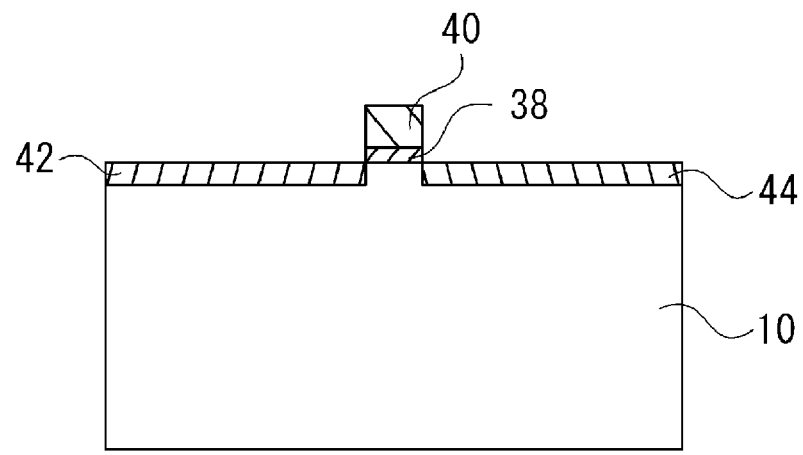
Figure 15C:
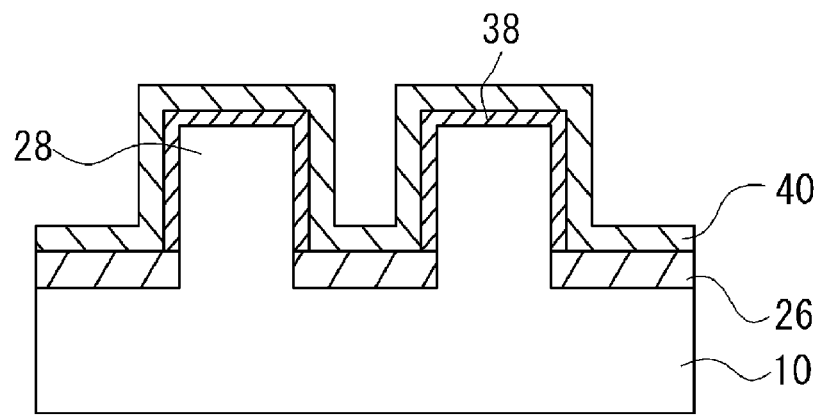

FIG. 15(a) is a perspective view showing an exemplary flash memory with a Fin type SONOS structure, according to a fourth embodiment. FIG. 15(b) is a cross sectional view taken along line A-A shown in FIG. 15(a). FIG. 15(c) is a sectional view taken along line B-B shown in FIG. 15(a). An insulation film 38 is not shown in FIG. 15(a). In FIG. 15(a) through FIG. 15(c), the protrusions 28 are formed on the semiconductor substrate 10 as a P-type silicon substrate or a silicon substrate with a P-type region. The insulation film 38, an ONO film formed of an oxide silicon film, a silicon nitride film, and an oxide silicon film, partially covers the protrusion 28 from both side surfaces to the top surface of the protrusion 28. A gate 40 (e.g., a polysilicon film) is in contact with the insulation film 38 and extends to intersect with the protrusions 28. A source 42 and a drain 44, as an active region in an N-type diffusion region defined by the gate 40, are disposed on both side surfaces and the top surface of the protrusion 28. The first oxide region 26 is formed on the surface of the semiconductor substrate 10 between adjacent protrusions 28 as a separation region.

Figure 16D:
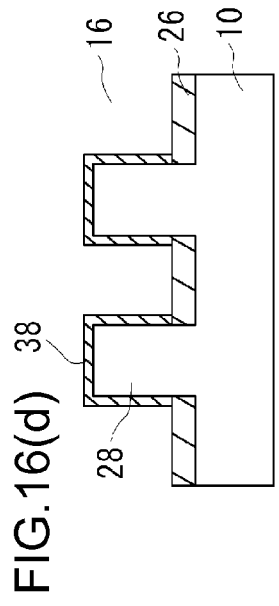
FIG. 16(a) through FIG. 16(f) illustrate an exemplary method for manufacturing the flash memory with the Fin type SONOS structure of FIG. 15(a), according to the fourth embodiment.
Figure 16E:
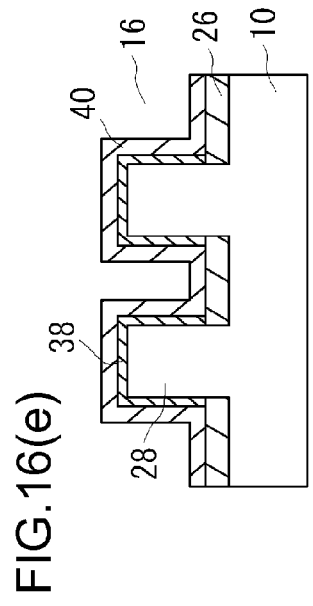
Figure 16F:
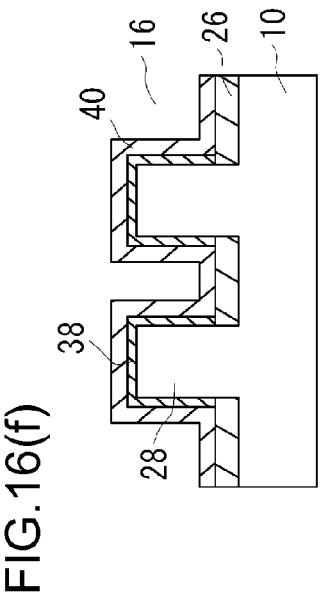
Figure 16A:
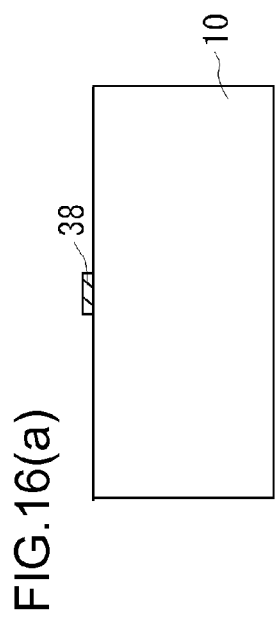
Figure 16B:
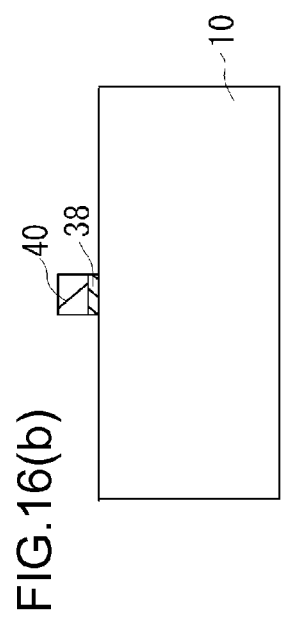
Figure 16C:
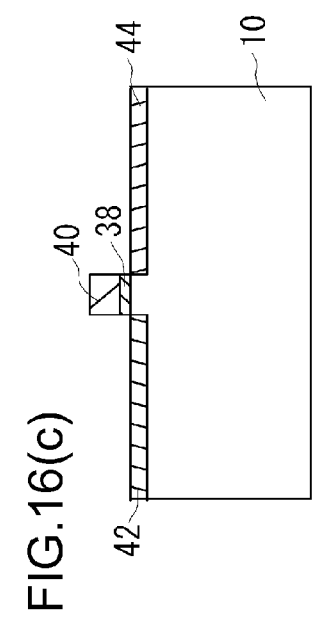

FIG. 16(a) through FIG. 16(f) illustrate an exemplary method for manufacturing the flash memory with the Fin type SONOS structure of FIG. 15(a), according to the fourth embodiment. FIG. 16(a) through FIG. 16(c) are cross sectional views taken along line A-A as shown in FIG. 15(a). FIGS. 16(d) to 16(f) are sectional views taken along line B-B as shown in FIG. 15(a). Besides the use of the P-type silicon substrate for the semiconductor substrate 10, the process steps in the embodiment including the step of forming the grooves 16 by dry etching the semiconductor substrate 10, that is, the step of forming the protrusions 28 between the adjacent grooves 16 are similar to those of the variation of the third embodiment as shown in FIGS. 13(a) to 14(b). The explanations of the similar or same features are omitted.

In FIG. 16(a) through FIG. 16(d), the dry etching is performed through the RIE process using the photoresist with a predetermined pattern as the mask such that only the oxide film 12 formed on the surface of the semiconductor substrate 10 is eliminated. That is, the first oxide region 26 on the surface of the semiconductor substrate 10 between the adjacent protrusions 28 is left as it is. The insulation film 38, as ONO film formed of an oxide silicon film, a silicon nitride film, and an oxide silicon film, is formed on the surface of the semiconductor substrate 10. The oxide silicon film and the silicon nitride film may be formed through a CVD (Chemical Vapor Deposition) process and the like. The insulation film 38 on the portion except the one on which the gate 40 is formed on both side surfaces and the top surface of the protrusion 28 is eliminated using the mask made of the photoresist with a predetermined pattern. That is, the insulation film 38 is formed on the portion of the protrusion 28 so as to cover from both side surfaces to the top surface.

In FIG. 16(b) and FIG. 16(e), the gate 40 is formed so as to be in contact with the insulation film 38 and extends to intersect with the protrusion 28. In FIG. 16(c) and FIG. 16(f), arsenic ions are implanted and the thermal processing is performed thereafter using the first oxide region 26 and the gate 40 as the mask to form the source 42 and the drain 44 as the active region of the N-type diffusion layer on both side surfaces and the top surface of the protrusion 28.

In the fourth embodiment, as shown in FIG. 15(a) through FIG. 15(c), the first oxide region 26 is formed on the surface of the semiconductor substrate 10 between the adjacent protrusions 28 as a separation region. The source 42 and the drain 44, as the active region formed on both side surfaces and the top surface of the adjacent protrusions 28, are electrically separated. In the resultant flash memory with the Fin type SONOS structure, the source 42 and the drain 44 are separated by the adjacent protrusions 28.

In the fourth embodiment, in FIG. 16(c) and FIG. 16(f), the arsenic ions are implanted using the first oxide region 26 on the surface of the semiconductor substrate 10 between the adjacent protrusions 28 as the mask to form the source 42 and the drain 44 as the active region on both side surfaces and the top surface of the protrusion 28. The arsenic ions are not implanted into the semiconductor substrate 10 below the first oxide region 26, and accordingly, the active region in the N-type diffusion region is not formed. The source 42 and the drain 44, as the active region electrically separated by the adjacent protrusions 28, may be easily formed on side surfaces and the top surface of the protrusion 28.

In FIG. 13(b) and FIG. 13(c) of the third embodiment, the first oxide region 26 may be easily formed by the oxygen ion implantation and then thermal processing to the semiconductor substrate 10. Referring to FIG. 14(b), the semiconductor substrate 10 above the first oxide region 26 serving as the stopper layer is dry etched to easily form the first oxide region 26 on the surface of the semiconductor substrate 10 between the adjacent protrusions 28. In the fourth embodiment, the source 42 and the drain 44 as the active region electrically separated by the adjacent protrusions 28 may be easily formed on both surfaces and top surface of the protrusion 28. In the fourth embodiment, the ONO film is used as the insulation film 38. However, the film is not limited to the one as described above. For example, the oxygen silicon film may be used as the insulation film 38 to provide the same effects as those of the fourth embodiment. If the oxide silicon film is used as the insulation film 38, the Fin type MOSFET structure may be obtained.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method for manufacturing a semiconductor device, comprising:

forming a first oxygen-containing region in a semiconductor substrate by performing an oxygen ion implantation to a portion of the semiconductor substrate;

oxidizing the first oxygen-containing region using oxygen contained therein by performing a thermal processing of the semiconductor substrate, wherein the first oxygen-containing region is converted to a first oxide region while suppressing oxidation of a surface of the semiconductor substrate; and forming a groove in the semiconductor substrate by eliminating the first oxide region, wherein the performing thermal processing comprises subjecting the first oxygen-containing region to a gas low on oxygen.

2. The method for manufacturing the semiconductor device according to claim 1, wherein the gas low on oxygen comprises an inert gas.

3. The method for manufacturing the semiconductor device according to claim 1, wherein the forming the first oxide-region comprises:

forming an oxide film on the semiconductor substrate;

forming a photoresist having an opening on the oxide film; and implanting oxygen ions to the portion of the semiconductor substrate using the photoresist as a mask.

4. The method for manufacturing the semiconductor device according to claim 1, wherein the oxygen ion implantation to the portion of the semiconductor substrate is performed multiple times at different energy levels with different doses of oxygen ions.

5. The method for manufacturing the semiconductor device according to claim 4, wherein the oxygen ion implantation is performed using a dose of $3.0 \times 10^{17}$ oxygen ions/cm$^2$ at implantation energy of 200 KeV, a dose of $2.5 \times 10^{17}$ oxygen ions/cm$^2$ at implantation energy of 120 KeV, and a dose of $2.5 \times 10^{17}$ ions/cm$^2$ at implantation energy of 40 KeV.

6. The method for manufacturing the semiconductor device according to claim 5, wherein the oxygen-containing region has an approximately 0.6 micrometers deep U-like shape.

7. The method for manufacturing the semiconductor device according to claim 1, wherein the thermal processing is performed for one hour using argon gas at 1200 degrees Celsius.

8. The method for manufacturing the semiconductor device according to claim 1, wherein the eliminating the first oxide region is performed using a wet etching process.

9. The method for manufacturing the semiconductor device according to claim 8, wherein the wet etching process is performed using a hydrofluoric acid.

10. The method for manufacturing the semiconductor device according to claim 1, wherein the oxygen-containing region has an approximately 0.17 micrometers deep U-like shape after the oxygen ion implantation is performed using a dose of $2.5 \times 10^7$ ions/cm$^2$ at implantation energy of 30 KeV.

11. The method for manufacturing the semiconductor device according to claim 1, wherein the depth of the oxygen-containing region is determined by the energy for the oxygen ion implantation.

* * * * *